United States Patent
Lee et al.

(10) Patent No.: US 11,144,466 B2
(45) Date of Patent: Oct. 12, 2021

(54) MEMORY DEVICE WITH LOCAL CACHE ARRAY

(71) Applicant: Intel Corporation, Santa Clara, CA (US)

(72) Inventors: Jongwon Lee, Hillsboro, OR (US); Vivek Kozhikkottu, Hillsboro, OR (US); Kuljit S. Bains, Olympia, WA (US); Hussein Alameer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 134 days.

(21) Appl. No.: 16/433,663

(22) Filed: Jun. 6, 2019

(65) Prior Publication Data
US 2019/0286566 A1    Sep. 19, 2019

(51) Int. Cl.
*G06F 12/0882* (2016.01)
*G11C 7/10* (2006.01)

(52) U.S. Cl.
CPC ........ *G06F 12/0882* (2013.01); *G11C 7/1069* (2013.01); *G11C 7/1096* (2013.01); *G06F 2212/305* (2013.01); *G06F 2212/452* (2013.01)

(58) Field of Classification Search
CPC .......... G06F 12/0882; G06F 2212/305; G06F 2212/452; G11C 7/1069; G11C 7/1096
USPC ...................................................... 711/119
See application file for complete search history.

(56) References Cited

U.S. PATENT DOCUMENTS

| | | | | |
|---|---|---|---|---|
| 5,900,011 A * | 5/1999 | Saulsbury | ........... | G06F 12/0897 711/119 |
| 7,555,597 B2 * | 6/2009 | Srivastava | .......... | G06F 12/0862 370/389 |
| 2015/0371689 A1 * | 12/2015 | Li | ....................... | G11C 11/4093 711/105 |
| 2017/0006303 A1 * | 1/2017 | Sethuraman | ........... | H04N 19/58 |
| 2018/0267931 A1 * | 9/2018 | Li | .......................... | G06F 9/3808 |
| 2019/0187894 A1 * | 6/2019 | Benisty | ............... | G06F 13/4282 |

OTHER PUBLICATIONS

V. Cuppu, B. Jacob, B. Davis and T. Mudge, "A performance comparison of contemporary DRAM architectures," Proceedings of the 26th International Symposium on Computer Architecture (Cat. No. 99CB36367), Atlanta, GA, USA, 1999, pp. 222-233, doi: 10.1109/ISCA.1999.765953. (Year: 1999).*

Giraud B., Thomas O., Amara A., Vladimirescu A., Belleville M. (2009) SRAM Circuit Design. In: Amara A., Rozeau O. (eds) Planar Double-Gate Transistor. Springer, Dordrecht. https://doi.org/10.1007/978-1-4020-9341-8_8 (Year: 2009).*

(Continued)

*Primary Examiner* — Reginald G Bragdon
*Assistant Examiner* — Aaron D Ho
(74) *Attorney, Agent, or Firm* — Green, Howard & Mughal LLP

(57) ABSTRACT

An embodiment of a memory device includes technology for a memory cell array logically organized in two or more banks of at least two rows and two columns per bank, and two or more local caches respectively coupled to the two or more banks of the memory cell array, where each local cache has a size which is an integer multiple of a memory page size of the memory cell array. Other embodiments are disclosed and claimed.

20 Claims, 5 Drawing Sheets

(56) References Cited

OTHER PUBLICATIONS

D. Kaseridis, J. Stuecheli and L. K. John, "Minimalist open-page A DRAM page-mode scheduling policy for the many-core era," 2011 44th Annual IEEE/ACM International Symposium on Microarchitecture (MICRO), Porto Alegre, 2011, pp. 24-35. (Year: 2011).*
A. Nowatzyk, Fong Pong and A. Saulsbury, "Missing the Memory Wall: The Case for Processor/Memory Integration," 23rd Annual International Symposium on Computer Architecture (ISCA'96), Philadelphia, PA, USA, 1996, pp. 90-90, doi: 10.1109/ISCA.1996.10008. (Year: 1996).*
"Applications Note: Understanding DRAM Operation", IBM, Dec. 1996 (Year: 1996).*
R. Huggahalli, R. Iyer and S. Tetrick, "Direct cache access for high bandwidth network I/O," 32nd International Symposium on Computer Architecture (ISCA'05), 2005, pp. 50-59, doi: 10.1109/ISCA.2005.23. (Year: 2005).*
H. Hidaka, Y. Matsuda, M. Asakura and K. Fujishima, "The cache DRAM architecture: a DRAM with an on-chip cache memory," in IEEE Micro, vol. 10, No. 2, pp. 14-25, Apr. 1990, doi: 10.1109/40.52944. (Year: 1990).*

\* cited by examiner

MEMORY DEVICE WITH LOCAL CACHE ARRAY

BACKGROUND

A memory device may include an array of memory cells suitably connected with wordlines (WLs), bitlines (BLs), and sense amplifiers (SAs) to read and write the contents of the memory cells. The array of memory cells may be nominally organized as a matrix of rows and columns Access to the contents of the array of memory cells may be coordinated with a row activation cycle.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
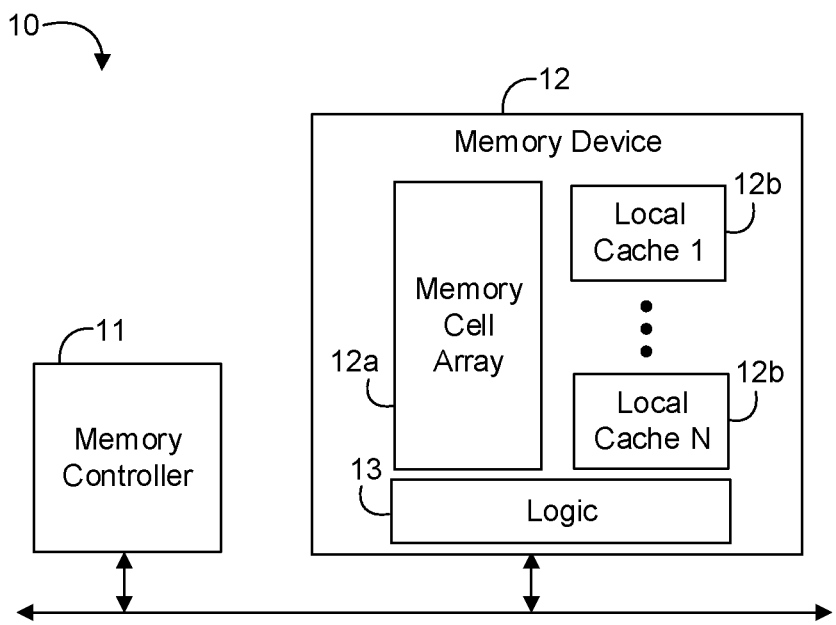
FIG. 1 is a block diagram of an example of a memory system according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Methods, devices, systems, and articles are described herein related to memory systems. More particularly, some embodiments relate to a memory device with a local cache array.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4B for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

In particular embodiments, high bandwidth memory (HBM) DRAM may comply with a standard promulgated by JEDEC, such as JESD235B for HBM (this standards are available at jedec.org). As noted at www.jedec.org, HBM DRAM is tightly coupled to the host compute die with a distributed interface. The interface is divided into independent channels. Each channel is completely independent of one another. Channels are not necessarily synchronous to each other. The HBM DRAM uses a wide-interface architecture to achieve high-speed, low-power operation. The HBM DRAM uses differential clock CK_t/CK_c. Commands are registered at the rising edge of CK_t, CK_c. Each channel interface maintains a 128b data bus operating at DDR data rates. Such standards (and similar standards) may be referred to as HBM-based standards and communication interfaces of the storage devices that implement such standards may be referred to as HBM-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

With reference to FIG. 1, an embodiment of a memory system 10 may include a memory controller 11, and a memory device 12 communicatively coupled to the memory controller 11. In some embodiments, the memory device 12 may include a memory cell array 12a logically organized in two or more banks of at least two rows and two columns per bank, and two or more local caches 12b (e.g., N>1) respectively coupled to the two or more banks the memory cell array 12a. For example, each local cache 12b may have a size which is an integer multiple of a memory page size of the memory cell array 12a (e.g., a same size as the memory page size, double the memory page size, four times the memory page size, etc.). In some embodiments, the memory device 12 may further include logic 13 to decode commands from the memory controller 11 to manage access to the memory cell array 12a and the two or more local caches 12b (e.g., the command decode logic may be configured to handle a cache array with a multiple of the page size). Any suitable memory technology including, but not limited, the memory technologies discussed above may be utilized for memory cell array 12a and the local caches 12b. Moreover, different memory technologies may be utilized for the memory cell array 12a and the local caches 12b. Reference herein to either a "row" or a "column" is nominal for the purposes of illustration or explanation of a conceptual memory array or matrix, and does not necessarily mean that all such cells are physically arranged in linear rows or columns. The term "row" or "column" is also nominal with respect to a particular memory system, and may be interchanged in some systems (e.g., what another system refers to as column major access may be the same as what is described herein as row major access; another systems column activation cycle may be the same as what is described herein as a row activation cycle; etc.).

In some embodiments, the logic 13 may be configured to fetch one or more cachelines into a specified local cache of the two or more local caches 12b based on an indicator in a read command. For example, the logic 13 may be configured to load a current superset of cachelines into the specified local cache based on a state of a bit in the read command, and/or to load a subsequent superset of cachelines into the specified local cache based on a state of a bit in the read command Additionally, or alternatively, the logic 13 may be further configured to fetch data from the memory cell array 12a into one of the two or more local caches 12b independent of a row activate cycle for the memory cell array 12a, and/or to provide read and write access for the memory controller 11 to data in the two or more local caches 12b independent of access to the memory cell array 12a.

Embodiments of each of the above memory controller 11, memory device 12, memory cells 12a, local caches 12b, logic 13a and other system components may be implemented in hardware, firmware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, the memory technologies discussed above, or any combination thereof. Embodiments of the memory controller 11 may include a general purpose controller, a special purpose controller, a processor, a central processor unit (CPU), a storage controller, a micro-controller, etc. In some embodiments, the memory cells 12a, local caches 12b, and/or logic 13a may be located in, or co-located with each other on a same die, and/or together with various components, including the memory controller 11.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C # or the like and conventional procedural programming languages, such as the "C" programming language or similar programming languages. For example, the memory device 12, persistent storage media, or other system memory may store a set of instructions which when executed by a processor or controller cause the system 10 to implement one or more components, features, or aspects of the system 10 (e.g., the logic 13, fetching cachelines into a specified local cache of the two or more local caches, fetching data from the memory cell array into one of the two or more local caches independent of the row activate cycle, providing read and write access for the memory controller to data in the two or more local caches independent of access to the memory cell array, etc.).

Figure 2:
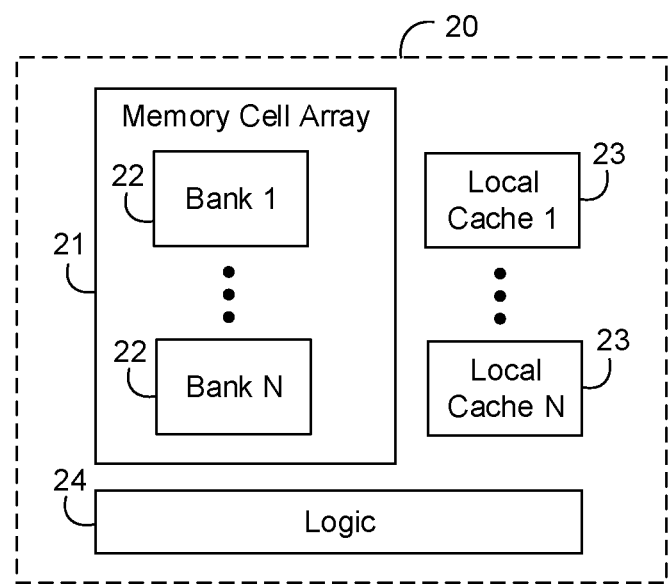
FIG. 2 is a block diagram of an example of a memory apparatus according to an embodiment.

With reference to FIG. 2, an embodiment of a memory apparatus 20 may include a memory cell array 21 logically organized in two or more banks 22 of at least two rows and two columns per bank, and two or more local caches 23 respectively coupled to the two or more banks 22 of the memory cell array 21, where each local cache 23 has a size which is an integer multiple of a memory page size of the memory cell array 21. Some embodiments of the apparatus 20 may further include logic 24 to decode commands from a memory controller to manage access to the memory cell array 21 and the two or more local caches 23. In some embodiments, the logic 24 may be configured to fetch one or more cachelines into a specified local cache of the two or more local caches 23 based on an indicator in a read command. For example, the logic 24 may be configured to load a current superset of cachelines into the specified local cache based on a state of a bit in the read command, and/or to load a subsequent superset of cachelines into the specified local cache based on a state of a bit in the read command Additionally, or alternatively, the logic 24 may be further configured to fetch data from the memory cell array 21 into one of the two or more local caches 23 independent of a row activate cycle for the memory cell array 21, and/or to provide read and write access for the memory controller to data in the two or more local caches 23 independent of access to the memory cell array 21.

Any suitable memory technology including, but not limited, the memory technologies discussed above may be utilized for memory cell array 21 and the local caches 23. Moreover, different memory technologies may be utilized for the memory cell array 21 and the local caches 23. In some embodiments, the illustrated apparatus 20 may be implemented as discrete components on a printed circuit board (PCB) substrate, or electronic/digital circuitry on one or more semiconductor substrate(s) (e.g., silicon, sapphire, gallium arsenide, a SoC, etc.) with suitable logic coupled to the substrate(s). In some embodiments, the logic 24 may be at least partly implemented in one or more of configurable logic and fixed-functionality hardware logic on semiconductor substrate(s). For example, the logic 24 may include a transistor array and/or other integrated circuit components coupled to the substrate(s) with transistor channel regions that are positioned within the substrate(s). The interface between the logic 24 and the substrate(s) may not be an abrupt junction. The logic 24 may also be considered to include an epitaxial layer that is grown on an initial wafer of the substrate(s).

Figure 3A:
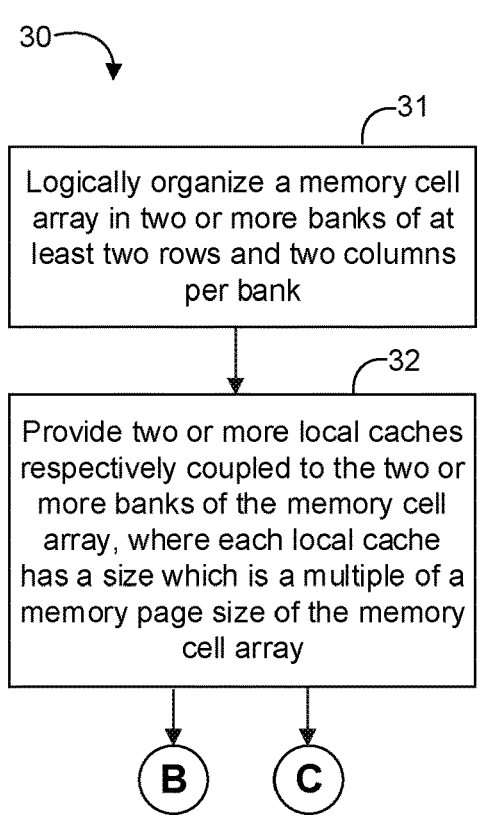
FIGS. 3A to 3C are flowcharts of an example of a method of controlling memory according to an embodiment.
Figure 3B:
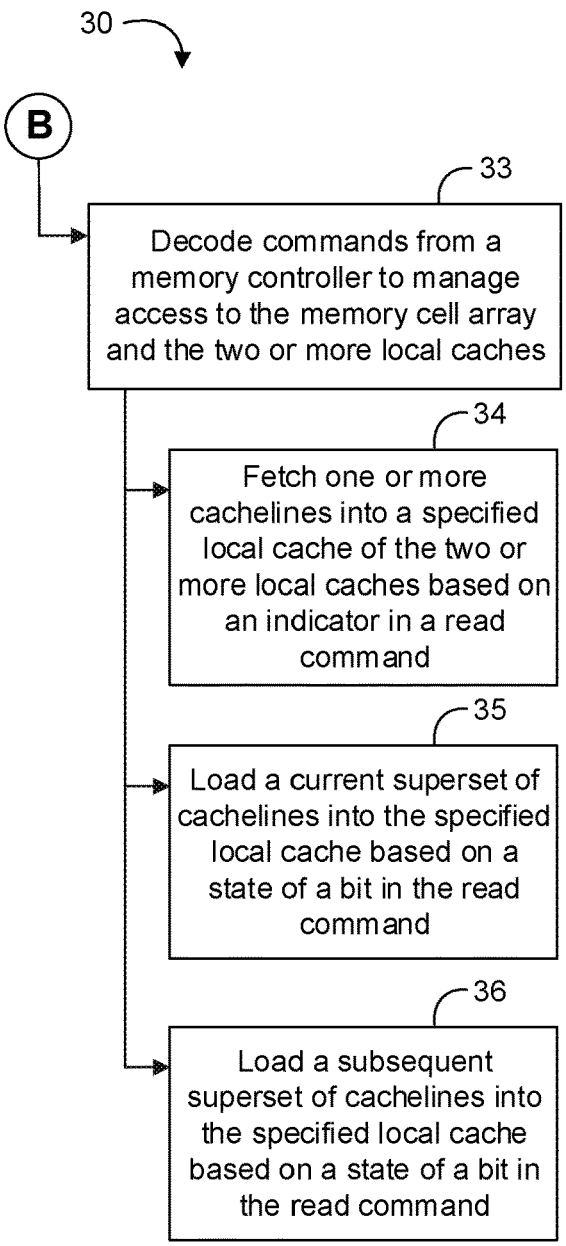
Figure 3C:
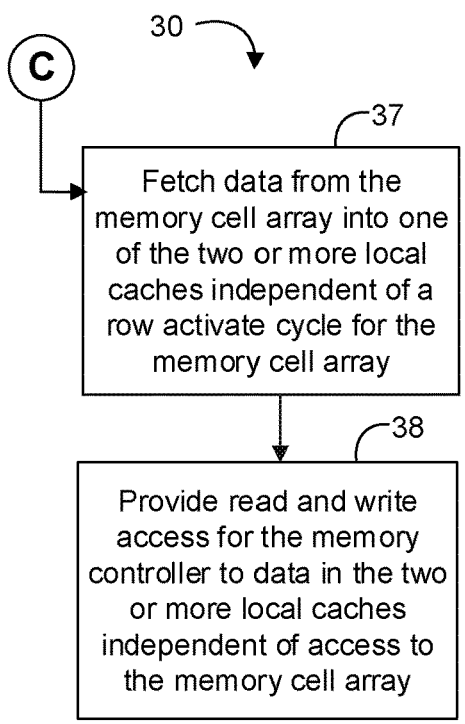

Turning now to FIGS. 3A to 3C, an embodiment of a method 30 of controlling memory may include logically organizing a memory cell array in two or more banks of at least two rows and two columns per bank at block 31, and providing two or more local caches respectively coupled to the two or more banks of the memory cell array, wherein each local cache has a size which is an integer multiple of a memory page size of the memory cell array at block 32. Some embodiments of the method 30 may further include decoding commands from a memory controller to manage access to the memory cell array and the two or more local caches at block 33. For example, the method 30 may include fetching one or more cachelines into a specified local cache of the two or more local caches based on an indicator in a read command at block 34, loading a current superset of cachelines into the specified local cache based on a state of a bit in the read command at block 35, and/or loading a subsequent superset of cachelines into the specified local cache based on a state of a bit in the read command at block 36. Some embodiments of the method 30 may also include fetching data from the memory cell array into one of the two or more local caches independent of a row activate cycle for the memory cell array at block 37, and/or providing read and write access for the memory controller to data in the two or more local caches independent of access to the memory cell array at block 38.

Embodiments of the method 30 may be implemented in a system, apparatus, computer, device, etc., for example, such as those described herein (e.g., the system 10, the apparatus 20, memory device 40, system 100, etc.). More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

For example, the method 30 may be implemented on a computer readable medium as described in connection with Examples 22 to 28 below. Embodiments or portions of the method 30 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Some embodiments may advantageously provide technology for a memory device having a local data cache array for improved performance and power. For some electronic systems, a page hit rate for HBM DRAMs may be lower than desired. For example, a linear streams may only achieve a 25% page hit rate. Some systems may also include a higher thermal challenge and may distribute cache lines around a SoC device to avoid hotspots. Sequential streams going to the same bank may be separated in time and interleaved across multiple cores, which may lead to page trash. Increasing the number of HBM banks may reduce or avoid page trashing between accesses across different cores. But adding more banks increases die size, cost, and power consumption. DRAM memory technology (e.g., including but not limited to HBM) may involve a row activate cycle which can create a bottleneck for the DRAM performance. One or more of the following problems may advantageously be overcome by the various embodiments described herein.

Some embodiments may include technology for a per bank row cache that has a size which is an integer multiple of a DRAM page size (e.g., 1×, 2×, etc.). For example, the row cache technology may be similar to a sense amp array technology and the row cache may be placed adjacent to the DRAM cells. In some embodiments, read commands (e.g., a column address strobe (CAS) command) are used with hints to fetch additional cachelines (CL's) into the row cache. For example, a bit in a CAS command may be used to load a current superset of four (4) CL's into the row cache, or a bit in the CAS command may be used to load a subsequent superset of four (4) CL's into the row cache. In some embodiments, the host device/agent keeps track of data in the row cache such that the host can issue specified CAS commands to read from the row cache.

Advantageously, some embodiments provide a performance benefit with the row cache. For example, performance for an embodiment of a row cache with four cachelines from several pages may be similar to adding eight time (8×) the bank count to a HBM. By using an embodiment of the row cache, the host controller can access the data without opening/accessing a DRAM's row, which is restricted by a row-activate cycle limit. Advantageously, access time to the row cache is on the order of CAS latency (e.g., 15 ns) as opposed to a random read access time (e.g., about 60 ns). System power consumption may also advantageously be reduced significantly because embodiments reduce the number of read activates and most of the DRAM functional power is consumed in opening a DRAM's row using an activate command (e.g., ACT). Performance and power consumption are also improved because some embodiments improve the page hit rate for read traffic.

Figure 4:
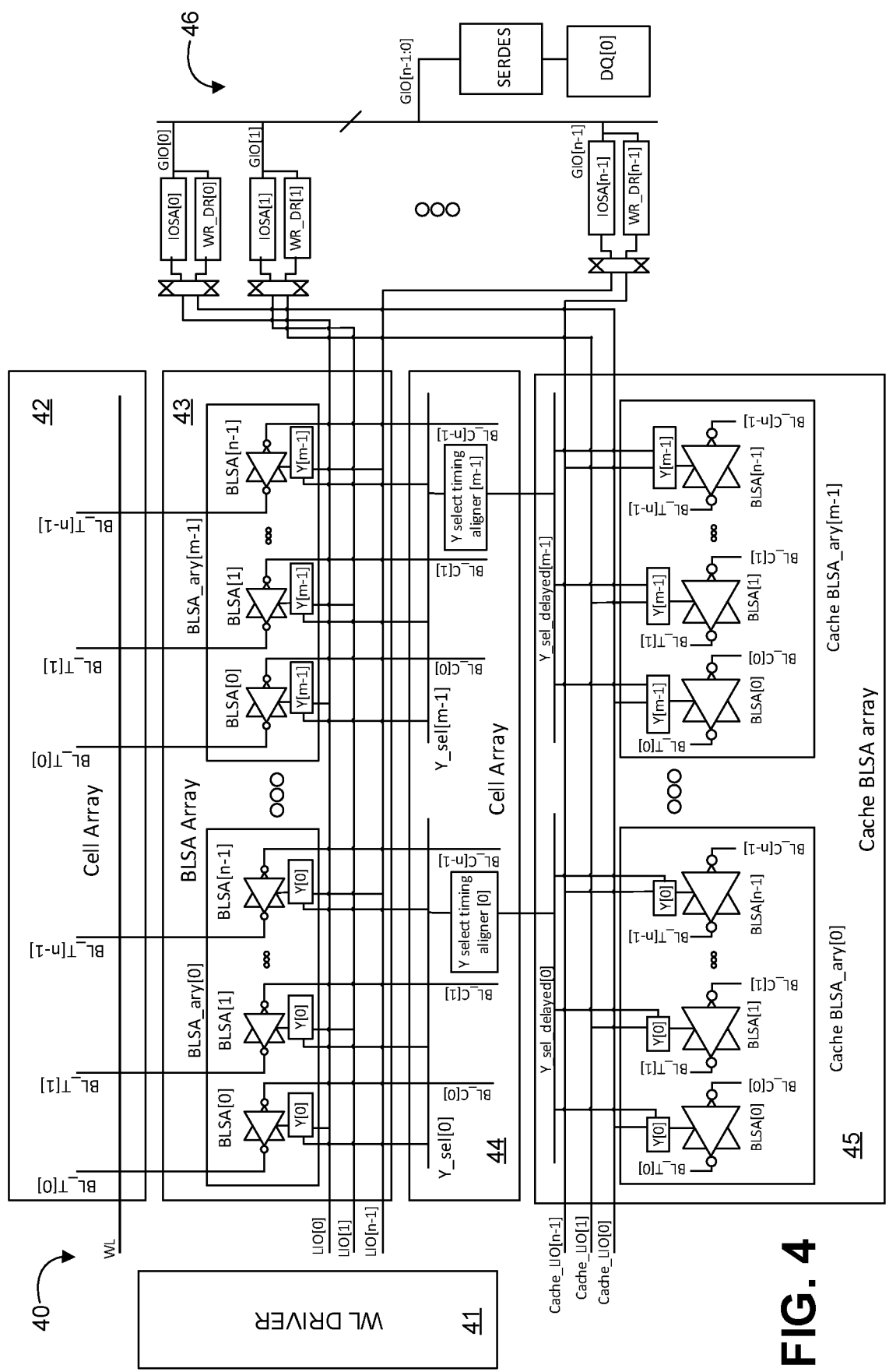
FIG. 4 is a block diagram of an example of a memory device according to an embodiment.

With reference to FIG. 4, an embodiment of a memory device 40 includes a WL driver 41, a first cell array 42, a bit-line sense amplifier (BLSA) 43, a second cell array 44, a cache BLSA array 45, and an output circuit 46, coupled as illustrated. The output circuit 46 includes a serializer/deserializer (SERDES) circuit. In the illustrated embodiment, the cell arrays 42, 44 may include DRAM technology, while the cache BLSA array 45 may include SRAM technology, which may be suitable for use with a DRAM memory controller (not shown). Given the benefit of the present application, those skilled in the art will appreciate that other embodiments may include different memory technologies, with appropriate changes made to the cell arrays, cache arrays, and decode logic.

For the simplified DRAM cell array architecture illustrated in FIG. 4, a memory controller may start a row access with a specific address to read/write data into the DRAM cell array 42. For the row access, a word line signal (WL) is open and cell data connected to WL will be connected to the BLSA array 43. The BLSA devices amplify and keep the data. After a specified timing specification (e.g., Row Address Strobe (RAS) to CAS Delay (tRCD)), the memory controller starts a column access which could be read or write. Based on the data packet size, specification per access, which is "n" in this example, one of the column selection signals Y_sel[m-1:0] connects "n" BLSA devices to local input/output (IO) signals (LIO[n-1:0]). The "n" LIOs are connected to "n" pair of I0 line sense amplifiers (IOSA) and write drivers (WR_driver) accordingly. Also, each pair is connected to one general IO (GIO) in order. The "n" GIOs are connected to SERDES which is connected to data pads (DQ).

In Write mode, after the controller opens the WL following the row access described above, the DRAM memory receives a data packet from the memory controller through DQ[0]. The SERDES block assigns and drives the data to the write drivers connected with each GIO. The write-driver (WR_Driver) writes the data into the BLSA devices connected by a Y_sel signal. Then, the BLSA devices write the data into the cells through the open WL.

In Read mode, similarly, after the WL is opened by the controller, cell data is amplified and kept in the BLSA array 43. The controller issues a read command to the DRAM. The DRAM opens a Y_sel signal and connects the BLSA array 43 into "n" LIOs. The BLSA array 43 writes the data into "n" IOSAs connected to "n" LIOs. Each IOSA amplifies and drives the data into the SERDES through "n" GIOs. The SERDES block drives out the data to the memory controller through the DQs.

The basic operations of read/write of the memory device 40 may be similar to and may use the same commands as conventional DRAM technology. Embodiments of the memory device 40 advantageously further include the cache array 45 adjacent to the cell arrays 42, 44, which may be banks of the memory device 40. For example, BLSA technology may be logically similar to SRAM cell technology. Accordingly, the cache BLSA array 45 can be considered as a SRAM cache memory 45. To improve the system performance with less power consumption, a memory controller can fetch DRAM cell data into the SRAM cache memory 45 and read/write data in/from the cache memory 45 anytime as necessary (e.g., independent from a row activate cycle or other cell array operations).

Advantageously, embodiments of a memory device with local cache may support a wide variety of new functions, with corresponding commands at the host and/or memory controller. Non-limiting examples of such new commands/functions include:

1) A command including/performing a function of fetching DRAM data into cache memory with proper address control, with automatic closing. The command/function includes an automatic sequential function of opening and closing a specific WL automatically after finishing fetch.

2) A command including/performing a function of fetching DRAM data into cache memory with proper address control. To support this function finishing properly, a memory controller sends a sequence of commands for opening a WL and closing the WL in time after fetching is finished.

3) A command including/performing a function of saving cached data into DRAM with proper address control, with an automatic sequential function of opening and closing of a specific WL automatically after finishing saving of the data into DRAM.

4) A command including/performing a function of saving cached data into DRAM with proper address control. To support this function finishing properly, a memory controller sends a sequence of commands for opening a WL and closing the WL in time after saving the data into DRAM is finished.

5) A command including/performing a function of reading cache only with proper address control, independent from the DRAM cell array.

6) A command including/performing a function of writing cache only with proper address control, independent from the DRAM cell array.

Given the benefit of the present application, other advantageous commands/functions may occur to those skilled in the art.

With reference to FIG. 4, an example of how the memory device may operate based on some of the foregoing commands follows. For example, if a memory controller issues a functional command performing "Fetching DRAM data into cache with proper address control" automatically opening an addressed WL, the DRAM will open the WL and the BLSA arrays 43 amplify and latch the cell data. Then, an internal timer block opens a Y_sel[ ] signal, which is addressed by the memory controller. Then, the data in the BLSA array 43 is driven to IOSA/WR_DR pairs through "n"

LIOs. The IOSAs amplify the data and the WR_DRIVERs drive the data into the cache memory 45 through "n" Cache_LIOs selected by a Y_sel_delayed[ ] signal. The Y_sel_delayed[ ] signal is a delayed signal from Y_sel in the block labeled as "Y select timing aligner" in FIG. 4 to a matching Y_sel_delayed timing with a data arriving time from a corresponding WR_DR. When Y_sel_delayed[ ] is opened and closed in order, data is written into the cells of the cache memory 45 and kept.

In another example, if there is an already open WL in DRAM, the memory controller can issue a functional command performing "Fetching DRAM data into cache with proper address control". Then, the DRAM opens the addressed Y_sel[ ] and the BLSA array 43 drives its data into the IOSAs through "n" LIOs. Similarly, the WR_DRs paired with the IOSAs write data into the cache array 45 through Cache_LIO[ ] when Y_sel_delayed[ ] is opened. The cache array 45 keeps the data when Y_sel_delay1 is closed. Similarly, the suggested memory supports functions of saving data from the cache array 45 into the DRAM cell arrays 42, 44. For example, the control scheme is a reverse procedure of the fetching operation.

Advantageously, the memory controller can perform a fetch or save data anytime the memory controller needs to. After filling the cache array, for example, the memory controller can read out data from the cache array with a corresponding command and write data into the cache array with another corresponding command. In another example, the memory controller can save the data from the cache array into the DRAM memory cells with another corresponding command Both read/write functions in the cache array are not restricted by the row activate cycle limitations. By removing these limitations, performing a read/write cache operation may be done without re-activating a word line. Advantageously, the system may perform faster with lower power consumption (e.g., as shown in FIG. 6 below).

Although not fully illustrated in FIG. 4, the memory device 40 includes suitable command decode logic to decode out request commands from the memory controller and to perform the associated functions. In some embodiments, the memory device 40 may multiple internal power regulators for supplying memory functional operation. The memory device may further include multiple groups of LIOs, IOSAs/WR_DRs, GIOs, SERDES, etc., as need to meet a particular system's requirements.

Figure 5:
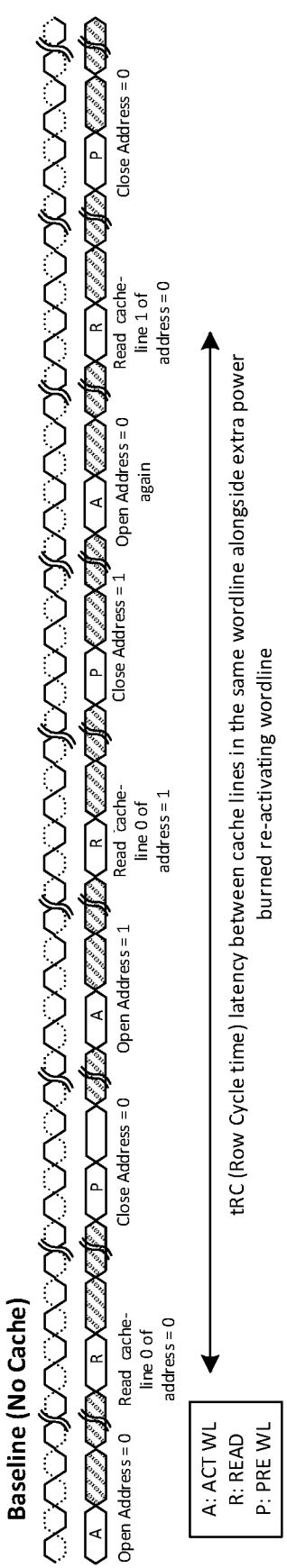
FIGS. 5 to 6 are illustrative timing diagrams of example memory operations according to embodiments.
Figure 6:
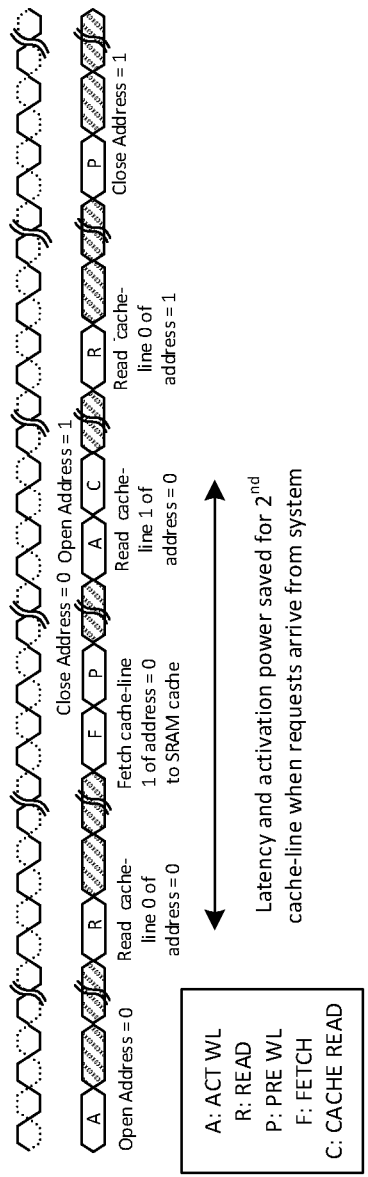

Turning now to FIGS. 5 and 6, illustrative timing diagrams show an embodiment may operate without utilizing the cache (e.g., FIG. 5, a baseline performance utilizing only conventional DRAM commands/functions) versus an embodiment which takes advantage of the local cache (e.g., FIG. 6, improved performance utilizing cache fetch and cache read commands/functions). The baseline operation involve more row activation commands, and consequently longer latency and more power consumption. The cache-enabled operation utilizes fewer row activations, thus improving both performance and power consumption.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 7:
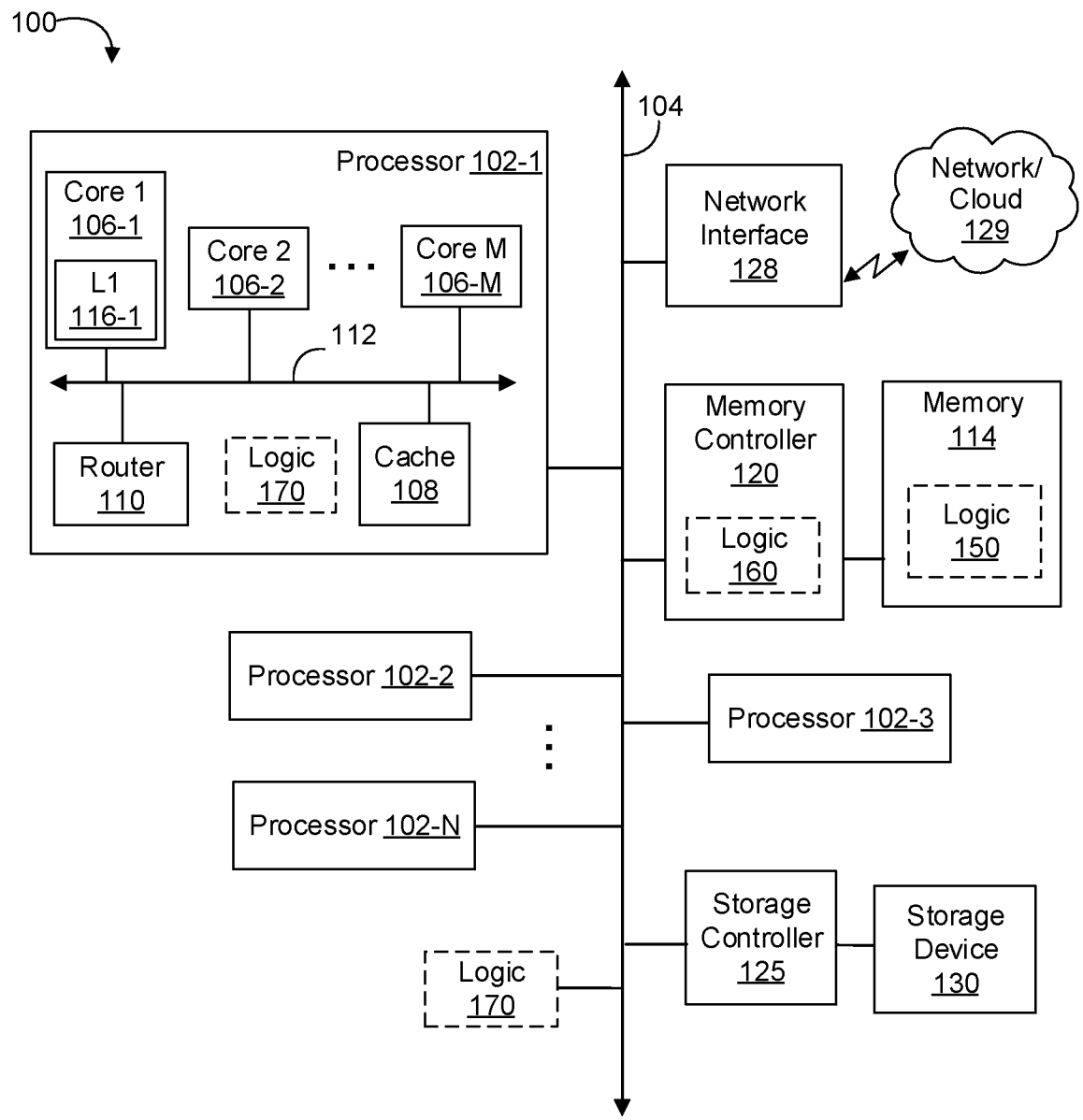
FIG. 7 is a block diagram of an example of a computing system according to an embodiment.

Turning now to FIG. 7, an embodiment of a computing system 100 may include one or more processors 102-1 through 102-N (generally referred to herein as "processors 102" or "processor 102"). The processors 102 may communicate via an interconnection or bus 104. Each processor 102 may include various components some of which are only discussed with reference to processor 102-1 for clarity. Accordingly, each of the remaining processors 102-2 through 102-N may include the same or similar components discussed with reference to the processor 102-1.

In some embodiments, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), logic 170, memory controllers, or other components.

In some embodiments, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that is utilized by one or more components of the processor 102-1, such as the cores 106. For example, the cache 108 may locally cache data stored in a memory 114 or storage device 130 for faster access by the components of the processor 102. As shown in FIG. 7, the memory 114 may be in communication with the processors 102 via the interconnection 104. In some embodiments, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 7, memory 114 may be coupled to other components of system 100 through a memory controller (MC) 120. Even though the MC 120 is shown to be coupled between the interconnection 104 and the memory 114, the MC 120 may be located elsewhere in system 100. For example, MC 120 or portions of it may be provided within one of the processors 102 in some embodiments. Advantageously, the memory 114 may include a memory cell array logically organized in two or more banks of at least two rows and two columns per bank, and two or more local caches respectively coupled to the two or more banks the memory cell array. For example, each local cache may have a size which is an integer multiple of a memory page size of the memory cell array. In some embodiments, the memory 114 may further include logic 150 to decode commands from the MC 120 to manage access to the memory cell array and the two or more local caches.

In some embodiments, the logic 150 may be configured to fetch one or more cachelines into a specified local cache of the two or more local caches based on an indicator in a read command. For example, the logic 150 may be configured to load a current superset of cachelines into the specified local cache based on a state of a bit in the read command, and/or to load a subsequent superset of cachelines into the specified local cache based on a state of a bit in the read command Additionally, or alternatively, the logic 150 may be further configured to fetch data from the memory cell array into one of the two or more local caches independent of a row activate cycle for the memory cell array, and/or to provide read and write access for the MC 120 to data in the two or more local caches independent of access to the memory cell array.

The system 100 may communicate with other devices/systems/networks via a network interface 128 (e.g., which is in communication with a computer network and/or the cloud 129 via a wired or wireless interface). For example, the network interface 128 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 129.

System 100 may also include a large capacity memory such as the storage device 130 coupled to the interconnect 104 via storage controller (SC) 125. Hence, SC 125 may control access by various components of system 100 to the storage device 130. Furthermore, even though SC 125 is shown to be directly coupled to the interconnection 104 in FIG. 7, SC 125 can alternatively communicate via a bus/interconnect (such as the SATA (Serial Advanced Technology Attachment) bus, Peripheral Component Interconnect (PCI) (or PCI EXPRESS (PCIe) interface), NVM EXPRESS (NVMe), etc.) with one or more other components of system 100 (for example where the bus is coupled to interconnect 104 via some other logic like a bus bridge, chipset, etc.) Additionally, SC 125 may be incorporated into other memory controller logic or provided on a same integrated circuit (IC) device in various embodiments (e.g., on the same circuit board device as the storage device 130 or in the same enclosure as the storage device 130).

Furthermore, SC 125 and/or storage device 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein), including the cores 106, interconnections 104 or 112, components outside of the processor 102, storage device 130, FM bus, SATA bus, SC 125, logic 160, logic 170, etc., to sense variations in various factors affecting power/thermal behavior of the system/platform, such as temperature, operating frequency, operating voltage, power consumption, and/or inter-core communication activity, etc.

As illustrated in FIG. 9, the memory 114 may include logic 150, which may be in the same enclosure as the memory 114 and/or fully integrated on a printed circuit board (PCB) of the memory 114. Advantageously, the logic 150 may include technology to implement one or more aspects of the method 30 (FIGS. 3A to 3C), the system 10, the apparatus 20, the memory device 40, and/or any of the memory array with integrated local cache array features discussed herein. The system 100 may include further logic 160 and logic 170 located outside of the memory 114. For example, the logic 160 may implement memory controller aspects of the embodiments described herein (e.g., issuing commands in appropriate sequences to implement functions and utilize the local caches of the memory 114, etc.). For example, the logic 170 may implement host aspects of the embodiments described herein (e.g., tracking what is stored in the local caches of the memory 114, etc.).

In some embodiments, the memory 114 may be configured with any suitable memory technology/media. In some embodiments, the logic 150 may be coupled to one or more substrates (e.g., silicon, sapphire, gallium arsenide, printed circuit board (PCB), etc.), and may include transistor channel regions that are positioned within the one or more substrates. As shown in FIG. 7, features or aspects of the logic 150, logic 160, and/or the logic 170 may be distributed throughout the system 100, and/or co-located/integrated with various components of the system 100.

ADDITIONAL NOTES AND EXAMPLES

Example 1 includes a memory system, comprising a memory controller, and a memory device communicatively coupled to the memory controller, the memory device including a memory cell array logically organized in two or more banks of at least two rows and two columns per bank, and two or more local caches respectively coupled to the two or more banks of the memory cell array, wherein each local cache has a size which is an integer multiple of a memory page size of the memory cell array.

Example 2 includes the system of claim 1, wherein the memory device further includes logic to decode commands from the memory controller to manage access to the memory cell array and the two or more local caches.

Example 3 includes the system of claim 2, wherein the logic is further to fetch one or more cachelines into a specified local cache of the two or more local caches based on an indicator in a read command.

Example 4 includes the system of claim 3, wherein the logic is further to load a current superset of cachelines into the specified local cache based on a state of a bit in the read command.

Example 5 includes the system of claim 3, wherein the logic is further to load a subsequent superset of cachelines into the specified local cache based on a state of a bit in the read command.

Example 6 includes the system of any of claims 2 to 5, wherein the logic is further to fetch data from the memory cell array into one of the two or more local caches independent of a row activate cycle for the memory cell array.

Example 7 includes the system of any of claims 2 to 5, wherein the logic is further to provide read and write access for the memory controller to data in the two or more local caches independent of access to the memory cell array.

Example 8 includes a memory apparatus, comprising a memory cell array logically organized in two or more banks of at least two rows and two columns per bank, and two or more local caches respectively coupled to the two or more banks of the memory cell array, wherein each local cache has a size which is an integer multiple of a memory page size of the memory cell array.

Example 9 includes the apparatus of claim 8, further comprising logic to decode commands from a memory controller to manage access to the memory cell array and the two or more local caches.

Example 10 includes the apparatus of claim 9, wherein the logic is further to fetch one or more cachelines into a specified local cache of the two or more local caches based on an indicator in a read command.

Example 11 includes the apparatus of claim 10, wherein the logic is further to load a current superset of cachelines into the specified local cache based on a state of a bit in the read command.

Example 12 includes the apparatus of claim 10, wherein the logic is further to load a subsequent superset of cachelines into the specified local cache based on a state of a bit in the read command.

Example 13 includes the apparatus of any of claims 9 to 12, wherein the logic is further to fetch data from the memory cell array into one of the two or more local caches independent of a row activate cycle for the memory cell array.

Example 14 includes the apparatus of any of claims 9 to 12, wherein the logic is further to provide read and write access for the memory controller to data in the two or more local caches independent of access to the memory cell array.

Example 15 includes a method of controlling memory, comprising logically organizing a memory cell array in two or more banks of at least two rows and two columns per bank, and providing two or more local caches respectively coupled to the two or more banks of the memory cell array, wherein each local cache has a size which is an integer multiple of a memory page size of the memory cell array.

Example 16 includes the method of claim 15, further comprising decoding commands from a memory controller to manage access to the memory cell array and the two or more local caches.

Example 17 includes the method of claim 16, further comprising fetching one or more cachelines into a specified local cache of the two or more local caches based on an indicator in a read command.

Example 18 includes the method of claim 17, further comprising loading a current superset of cachelines into the specified local cache based on a state of a bit in the read command.

Example 19 includes the method of claim 17, further comprising loading a subsequent superset of cachelines into the specified local cache based on a state of a bit in the read command.

Example 20 includes the method of any of claims 16 to 19, further comprising fetching data from the memory cell array into one of the two or more local caches independent of a row activate cycle for the memory cell array.

Example 21 includes the method of any of claims 16 to 19, further comprising providing read and write access for the memory controller to data in the two or more local caches independent of access to the memory cell array.

Example 22 includes at least one machine readable medium comprising a plurality of instructions that, in response to being executed on a computing device, cause the computing device to logically organize a memory cell array in two or more banks of at least two rows and two columns per bank, and provide two or more local caches respectively coupled to the two or more banks of the memory cell array, wherein each local cache has a size which is an integer multiple of a memory page size of the memory cell array.

Example 23 includes the machine readable medium of claim 22, comprising a plurality of further instructions that, in response to being executed on the computing device, cause the computing device to decode commands from a memory controller to manage access to the memory cell array and the two or more local caches.

Example 24 includes the machine readable medium of claim 23, comprising a plurality of further instructions that, in response to being executed on the computing device, cause the computing device to fetch one or more cachelines into a specified local cache of the two or more local caches based on an indicator in a read command.

Example 25 includes the machine readable medium of claim 24, comprising a plurality of further instructions that, in response to being executed on the computing device, cause the computing device to load a current superset of cachelines into the specified local cache based on a state of a bit in the read command.

Example 26 includes the machine readable medium of claim 24, comprising a plurality of further instructions that, in response to being executed on the computing device, cause the computing device to load a subsequent superset of cachelines into the specified local cache based on a state of a bit in the read command.

Example 27 includes the machine readable medium of any of claims 23 to 26, comprising a plurality of further instructions that, in response to being executed on the computing device, cause the computing device to fetch data from the memory cell array into one of the two or more local caches independent of a row activate cycle for the memory cell array.

Example 28 includes the machine readable medium of any of claims 23 to 26, comprising a plurality of further instructions that, in response to being executed on the computing device, cause the computing device to provide read and write access for the memory controller to data in the two or more local caches independent of access to the memory cell array.

Example 29 includes a memory apparatus, comprising means for logically organizing a memory cell array in two or more banks of at least two rows and two columns per bank, and means for providing two or more local caches respectively coupled to the two or more banks of the memory cell array, wherein each local cache has a size which is an integer multiple of a memory page size of the memory cell array.

Example 30 includes the apparatus of claim 29, further comprising means for decoding commands from a memory controller to manage access to the memory cell array and the two or more local caches.

Example 31 includes the apparatus of claim 30, further comprising means for fetching one or more cachelines into a specified local cache of the two or more local caches based on an indicator in a read command.

Example 32 includes the apparatus of claim 31, further comprising means for loading a current superset of cachelines into the specified local cache based on a state of a bit in the read command.

Example 33 includes the apparatus of claim 31, further comprising means for loading a subsequent superset of cachelines into the specified local cache based on a state of a bit in the read command.

Example 34 includes the apparatus of any of claims 30 to 33, further comprising means for fetching data from the memory cell array into one of the two or more local caches independent of a row activate cycle for the memory cell array.

Example 35 includes the apparatus of any of claims 30 to 33, further comprising means for providing read and write access for the memory controller to data in the two or more local caches independent of access to the memory cell array.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A memory apparatus, comprising:
   a memory cell array logically organized in two or more banks of at least two rows and two columns per bank;
   two or more local caches respectively coupled to the two or more banks of the memory cell array, wherein each local cache has a size which is an integer multiple of a memory page size of the memory cell array; and
   logic to decode local cache specific commands from a memory controller to manage direct access to the two or more local caches.

2. The apparatus of claim 1, wherein the logic is further to:
   decode commands from the memory controller to manage access to the memory cell array and the two or more local caches.

3. The apparatus of claim 2, wherein the logic is further to:
   fetch one or more cachelines into a specified local cache of the two or more local caches based on an indicator in a read command.

4. The apparatus of claim 3, wherein the logic is further to:
   load a current superset of cachelines into the specified local cache based on a state of a bit in the read command.

5. The apparatus of claim 3, wherein the logic is further to:
load a subsequent superset of cachelines into the specified local cache based on a state of a bit in the read command.

6. The apparatus of claim 2, wherein the logic is further to:
fetch data from the memory cell array into one of the two or more local caches with timing that is independent of a row activate timing cycle for the memory cell array in response to a command.

7. The apparatus of claim 2, wherein the logic is further to:
provide read and write access for the memory controller to data in the two or more local caches independent of access to the memory cell array.

8. A memory system, comprising:
a memory controller; and
a memory device communicatively coupled to the memory controller, the memory device including:
a memory cell array logically organized in two or more banks of at least two rows and two columns per bank,
two or more row caches respectively coupled to the two or more banks of the memory cell array, wherein each row cache has a size which is an integer multiple of a memory page size of the memory cell array, and
logic to decode row cache specific commands from the memory controller to manage direct access to the two or more row caches.

9. The system of claim 8, wherein the logic is further to:
decode commands from the memory controller to manage access to the memory cell array.

10. The system of claim 8, wherein the logic is further to:
fetch one or more cachelines into a specified row cache of the two or more row caches based on an indicator in a column address strobe command.

11. The system of claim 10, wherein the logic is further to:
load a current superset of cachelines into the specified row cache based on a state of a bit in the column address strobe command.

12. The system of claim 10, wherein the logic is further to:
load a subsequent superset of cachelines into the specified row cache based on a state of a bit in the column address strobe command.

13. The system of claim 8, wherein the logic is further to:
fetch data from the memory cell array into one of the two or more row caches with timing that is independent of a row activate timing cycle for the memory cell array.

14. The system of claim 8, wherein the logic is further to:
provide read and write access for the memory controller to data in the two or more row caches in response to the row cache specific commands.

15. A method of controlling memory, comprising:
logically organizing a memory cell array in two or more banks of at least two rows and two columns per bank;
providing two or more local caches respectively coupled to the two or more banks of the memory cell array, wherein each local cache has a size which is an integer multiple of a memory page size of the memory cell array; and
decoding local cache specific commands from a memory controller to manage direct access to the two or more local caches.

16. The method of claim 15, further comprising:
decoding commands from the memory controller to manage access to the memory cell array and the two or more local caches.

17. The method of claim 16, further comprising:
fetching one or more cachelines into a specified local cache of the two or more local caches based on an indicator in a read command.

18. The method of claim 17, further comprising:
loading a current superset of cachelines into the specified local cache based on a state of a bit in the read command.

19. The method of claim 17, further comprising:
loading a subsequent superset of cachelines into the specified local cache based on a state of a bit in the read command.

20. The method of claim 16, further comprising:
providing read and write access for the memory controller to data in the two or more local caches independent of access to the memory cell array.

* * * * *